United States Patent [19]

Demmer et al.

[11] Patent Number: 4,632,900

[45] Date of Patent: Dec. 30, 1986

[54] PROCESS FOR THE PRODUCTION OF IMAGES AFTER ELECTRODEPOSITION OF POSITIVE PHOTORESIST ON ELECTRICALLY CONDUCTIVE SURFACE

[75] Inventors: Christopher G. Demmer, Cherry Hinton; Edward Irving, Burwell, both of England; Ewald Losert, Rheinfelden, Switzerland

[73] Assignee: Ciba-Geigy Corporation, Ardsley, N.Y.

[21] Appl. No.: 708,998

[22] Filed: Mar. 7, 1985

[30] Foreign Application Priority Data

Mar. 7, 1984 [GB] United Kingdom ............... 8405958
Dec. 1, 1984 [GB] United Kingdom ............... 8430376

[51] Int. Cl.$^4$ .................... G03F 7/36; H05K 3/06
[52] U.S. Cl. .................... 430/323; 430/165; 430/168; 430/190; 430/192; 430/193; 430/270; 430/275; 430/278; 430/286; 430/318; 430/326; 430/327
[58] Field of Search ............ 430/323, 326, 168, 190, 430/192, 193, 165, 270, 275, 277, 278, 286, 318, 327

[56] References Cited

U.S. PATENT DOCUMENTS

| | | | |
|---|---|---|---|
| 3,738,835 | 6/1973 | Bakos | 430/286 |
| 3,849,137 | 11/1974 | Barzynski et al. | 430/281 |
| 3,890,152 | 6/1975 | Ruckert et al. | 430/175 |
| 3,991,033 | 11/1976 | Sam | 430/270 |
| 4,080,246 | 3/1978 | Battisti et al. | 430/192 |
| 4,086,210 | 4/1978 | Petropoulos | 430/270 |
| 4,105,518 | 8/1978 | McGinniss | 430/286 |
| 4,306,010 | 12/1981 | Uehara et al. | 430/190 |
| 4,362,853 | 12/1982 | Demmer | 525/533 |
| 4,414,311 | 11/1983 | Walls et al. | 430/175 |

FOREIGN PATENT DOCUMENTS

| | | | |
|---|---|---|---|
| 1147195 | 5/1983 | Canada | 430/286 |
| 1227602 | 4/1971 | United Kingdom | 430/192 |
| 1329888 | 9/1973 | United Kingdom | 430/190 |
| 1330932 | 9/1973 | United Kingdom | 430/190 |
| 1489402 | 10/1977 | United Kingdom | 430/286 |

Primary Examiner—Charles L. Bowers, Jr.
Attorney, Agent, or Firm—Luther A. R. Hall

[57] ABSTRACT

A positive photoresist is electrodeposited onto a substrate, exposed to actinic radiation in a predetermined pattern, and then exposed areas are removed by contact with a developer.

When the substrate is a metal-faced laminate, the exposed metal surface may be etched and the residual electrodeposited layer removed by contact with a suitable solvent, optionally after a second, general, exposure to actinic radiation.

Suitable electrodepositable positive photoresists include o-nitrocarbinol esters and o-nitrophenyl acetals, their polyesters and end-capped derivatives and quinone diazide sulphonyl esters of phenolic novolaks, having salt-forming groups in the molecule, especially carboxylic acid and amine groups.

The process is suitable for the production of printing plates and printed circuits, especially circuits on both sides of a liminate sheet linked conductively through metal-lined holes in the sheet.

19 Claims, No Drawings

PROCESS FOR THE PRODUCTION OF IMAGES AFTER ELECTRODEPOSITION OF POSITIVE PHOTORESIST ON ELECTRICALLY CONDUCTIVE SURFACE

This invention relates to a method for producing images on substrates, and to the use of this method in preparing printing plates and printed circuits, especially printed circuits on both sides of a laminate sheet connected by metal-lined apertures through the sheet.

Conventionally, images are produced on substrates by coating the substrate with a negative photoresist comprising a photopolymerisable material, irradiating the coating with actinic radiation through a negative, so that the parts of the coating struck by the radiation become photopolymerised and less soluble, whilst those parts shielded from the radiation remain substantially unaffected, then dissolving away the unirradiated, non-photopolymerised parts of the coating by means of a suitable solvent that does not dissolve the photopolymerised parts. This last stage is known as development. After development the exposed surface may be etched to form a printing plate or printed circuit. The photopolymerised coating may then be removed, either chemically by means of a solvent, or mechanically by means of brushes etc., or, more usually, by a combination of both methods.

Images have also been made by a similar process but in which the photopolymerisable material is replaced by a positive photoresist. This is a material that is rendered more soluble in a developing solvent by exposure to actinic radiation. Irradiation through an image-bearing transparency and development results in formation of a positive image.

The use of a positive photoresist usually gives an image having better resolution than one obtained using a photopolymerisable material. A drawback of positive photoresists is that their adherence to the substrate is not usually as effective as that obtained with photopolymerisable materials, and so they need more careful handling if damage to the image is to be avoided. There is therefore a need for improving the adherence of positive photoresists in order to maximise the advantages of positive working. It has now been fond that if the positive photoresist is applied by electrodeposition, its adherence to the substrate improves markedly.

The application of a photosensitive layer by electrodeposition is not, in itself, novel. For example, Britisth Patent Specification No. 1 489 402 describes photocurable resin compositions comprising certain vinyl and vinylidene resins having free acid groups linked to the main chain, and states that these compositions may be applied by electrodeposition to metallic substrates such as aluminium, iron, copper, and stainless steel. Further, U.S. Pat. No. 3,738,835 describes photoresist compositions which are emulsions of polychloroprene, a sensitiser, a stabiliser, a binder, a wetting agent, N-methyl-2-pyrrolidone and triethanolamine. It is stated that these compositions may be applied electrophoretically to coat irregularly-shaped articles. These specifications do not, however, describe the electrodeposition of a positive photoresist, nor do they suggest the advantages which can be achieved by using such electrodeposition.

Accordingly, this invention provides a process for the production of images which comprises (i) applying by electrodeposition a layer of a positive photoresist onto a substrate, (ii) exposing the electrodeposited layer to actinic radiation in a predetermined pattern, such that the exposed areas of the electrodeposited layer become more soluble in a developer than the unexposed areas, and (iii) removing said exposed areas by contact with a developer.

Substrates upon which the photoresist may be electrodeposited must, of course, be capable of accepting an electrical charge and may be of carbon, silicon, thermoset resin optionally containing electroconductive particles or, preferably, they are of a metal such as steel, aluminium, or copper, either as a solid metal sheet or as a metal-faced laminate.

Images formed by this method are suitable for use as printing plates and for forming into printed circuits. For the latter purpose, and sometimes for the former, the surface exposed by image development is a metal and this is removed by an etching process. The residual coating of photoresist may then be removed by further contact with a solvent, which may be the same as that used to develop the image, or it may be different. Removal of the photoresist coating is made considerably easier if there is made a further exposure to actinic radiation, this exposure being overall, not imagewise. This further processing of the image-bearing substrate has been found to be of particular use in the preparation of printed circuits on both faces of a flat substrate, linked conductively.

In the formation of printed circuits on both faces of a metal-faced laminate, linked by apertures through the laminate having metal linings, it is essential that the metal in the apertures be protected from the etching bath, since any etching will destroy the electrical continuity between one side of the laminate and the other. It is seldom possible, however, to fully irradiate the lining of an aperture, and so if a liquid photopolymerisable composition is applied to a laminate having apertures, the normal development and etching process is very likely to remove the metal lining the aperture, even though this was not intended. To overcome this difficulty such laminates are usually coated by means of a solid photopolymerisable film that bridges the apertures, rendering irradiation of the aperture surface unnecessary. Exposure, development, and removal of residual film then follow, according to the usual practice. This method does, however, suffer from at least one drawback. In order to produce a sharp, well defined image, it is essential that the solid photopolymerisable film be as thin as possible. In the manufacture of such very thin films it is inevitable that faults, particularly pinholes, occur from time to time. Should such a pinhole coincide with an aperture in the base laminate, protection is no longer afforded from the etching bath and the conducting layer linking the two sides of the laminate is destroyed.

The use of a positive working photoresist avoids the need to use a solid film, since unirradiated areas lining the apertures remain coated after development has taken place. There remains the problem of coating uniformly the surface of an aperture. Methods of coating designed for smooth surfaces, such as rolling, brushing or curtain coating, cannot give an even coating when apertures are present. Similarly dipping methods are not satisfactory since small apertures are liable to become blocked by the composition, and while excellent protection from the etching bath is afforded, removal of the resin, to enable electrical contact to be made, becomes very difficult.

It has now been found that the disadvantages of prior art methods can be overcome by a process in which a layer of a positive photoresist is applied by electrodeposition. Such electrodeposition of positive-working photoresists has the advantage that very uniform coverage is obtainable, which is particularly important on edges and in plated through-holes, using relatively thin films of the photoresist. The use of thin, uniform films offers the potential of improved resolution compared with conventional film and liquid photoresists. A further advantage is that there is a reduced need for 'islands' around the plated through-holes since there is no solid film requiring support, and hence a greater area of the circuit board is available for conductor tracks. Also, electrodepositable photoresists can be formulated with a minimal organic solvent content and may be deposited at a very high solids content, giving important safety and environmental benefits. Finally, resist utilisation is very high and complete automation of the coating process is possible.

After the electrodeposition, the process comprises exposing the coating imagewise to actinic radiation, removing the exposed parts by contact with a developing liquid, removing the thus exposed metal by means of an etching process, optionally exposing all of the residual coating to actinic radiation, and finally removing the residual coating by contact with a suitable solvent liquid.

Accordingly, this invention further provides a process for the production of a metallic image on a substrate which comprises (i) applying by electrodeposition a layer of a positive photoresist onto the metal surface of a metal faced laminate, (ii) exposing the electrodeposited layer to actinic radiation in a predetermined pattern, such that the electrodeposited layer becomes more soluble in a developer in the exposed areas than in the unexposed areas, (iii) removing the layer in said exposed areas by contact with a developer, (iv) removing the metal from the exposed areas by contact with a suitable etching solution, and (v) removing the residual electrodeposited layer by contact with a suitable solvent.

Removal of the residual electrodeposited layer may be effected in a single step, by contact with a solvent that is more effective than the developer used in the third stage of this process, or by leaving the layer in contact with the developer for a longer period than is used in the third stage of this process. Preferably, however, removal of this layer is preceded by a further exposure to actinic radiation, which exposure solubilises the residual layer and hence promotes its more rapid removal or allows the use of milder conditions. This invention therefore also comprises a process in which the final stage (v) is preceded by (iv.a) further exposing the laminate to actinic radiation, such that the residual electrodeposited layer is solubilised, the other stages being as described.

This invention also provides images on a substrate, prepared by the new process.

The expression "exposing in a predetermined pattern" includes both exposure through an image-bearing transparency and exposure to a laser beam moved as directed by a computer to form an image.

The positive photoresists used in accordance with the present invention must be electrodepositable, and hence are used as salts. It follows that they must have salt-forming groups in the molecule such as amine, or carboxylic, sulphonic or phosphonic acid groups. They must also be rendered more soluble in a developing solvent when exposed to actinic radiation. A number of materials, or mixtures of materials, are known to have this latter property, for example the polyoxymethylene polymers described in U.S. Pat. No. 3,991,033, the o-nitrocarbinol esters described in U.S. Pat. No. 3,849,137, the o-nitrophenyl acetals, their polyesters, and end-capped derivatives described in U.S. Pat. No. 4,086,210, and benzo- and naphthoquinonediazide sulphonic esters such as those described in British Patent Specifications Nos. 1 227 602, 1 329 888, and 1 330 932, and in U.S. Pat. No. 4,306,010.

The preferred photosensitive materials used in the present process are therefore salts of polyoxymethylene polymers bearing salt-forming groups, o-nitrocarbinol esters bearing salt-forming groups, o-nitrophenyl acetals, their polyesters and end-capped derivatives bearing salt-forming groups, and benzo- and naphthoquinone diazide sulphonic esters bearing salt-forming groups. The preferred salt-forming groups on these materials are amine groups and carboxylic, sulphonic and phosphonic acid groups. Salts of amine-group containing materials may be prepared by treatment with an organic or inorganic acid, such as acetic, lactic, trichloroacetic, methane sulphonic, glycolic, p-toluene sulphonic, hydrochloric, or sulphuric acids. Salts of acid group-containing materials may be prepared by treatment with an organic or inorganic base, such as triethylamine, triethanolamine, diethanolamine, pyridine, morpholine, sodium or potassium hydroxide, sodium or potassium carbonate, or sodium or potassium ethoxide.

The introduction of salt-forming groups into such molecules may be effected following known techniques. For example, a photosensitive o-nitrophenyl acetal may be prepared from o-nitrobenzaldehyde and a dihydric alcohol, either or both of which may contain protected or free amino or acid groups. After condensation has taken place the protecting groups, if present, are removed. Polyesters of such acetals, or of similar acetals but having no salt-forming group present, may be prepared by reaction with a dicarboxylic acid or its reactive derivative such as anhydride, containing a suitable salt-forming substituent. Typically, a dicarboxylic acid anhydride containing a free carboxylic acid group, such as trimellitic anhydride, may be used. Alternatively the acetal, whether containing salt-forming groups or not, may be end-capped by reaction with a carboxylic acid or its reactive derivative containing a suitable salt-foming group.

Polymers containing o-nitrocarbinol ester groups and free carboxylic acid groups may be prepared by copolymerising an o-nitrocarbinol ester of an unsaturated acid, particularly acrylic or methacrylic acid, with that acid, or an unsaturated acid, optionally in the presence of other unsaturated monomers, following known copolymerizing techniques. Polymers containing o-nitrocarbinol ester groups and free carboxylic or amino groups may also be prepared by esterification of the carboyxl groups of a polycarboxylic acid, with an aromatic carbinol, either or both of which contain free or protected carboyxlic acid or amino groups, followed by removal of the protecting groups if necessary.

Photosensitive quinone diazide group-containing salts may be prepared either by condensation of a suitable reactive 'backbone' resin qith a quinone diazide sulphonic acid or a reactive derivative thereof, such as a halide, anhydride, or ester, or by reaction of a suitable reactive monomer with such a sulphonic acid or reactive derivative followed by an addition or condensation reaction with a suitable reactant, to form the resin. If the monomeric species or the resin starting material contains salt-forming groups, salification can follow immediately, using known methods. Where salt-forming groups are not already present, they may be condensed onto the resin by known methods, for example a resin containing an active hydrogen atom may undergo a Mannich reaction with an aldehyde and an amine. The resultant Mannich base will form salts with acids. Alternatively if the Mannich reaction is carried out using an aminoacid, the resultant product has free acid groups that will form salts with bases. Preferably quinone-diazide group-containing salts are prepared having a phenolic novolak 'backbone', the quinone diazide groups and the solubilising groups being formed either on the novolak itself or on the phenol used to prepare it.

Salts of these photosensitive materials are made by known methods, particularly by neutralisation of the acid or base in an aqueous medium to give a solution of the salt. Such salts are usually not isolated but are used in the solution thus made for the electrodeposition stage of the present process.

Certain preferred electrodepositable positive photoresists, salts of which are used in the present invention are of the formula

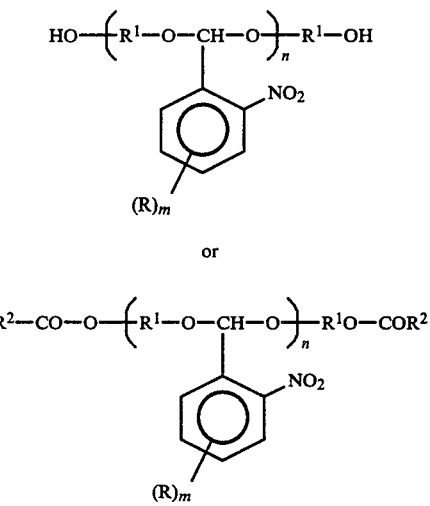

or they may contain a repeating unit of formula

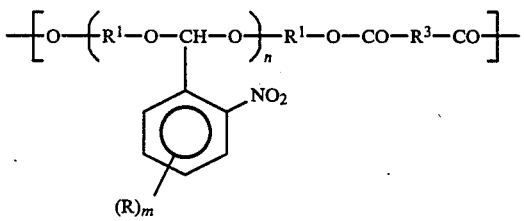

where
m represents zero or an integer of from 1 to 4,
n represents an integer of from 1 to 20,
R represents an alkyl, alkoxy, nitro, amino, or carboxylic acid group, such groups being the same or different when m is greater than 1, $R^1$ represents the residue of an organic diol remaining after removal of the two hydroxyl groups and which may be substituted by an amino or carboxylic acid group, such as a divalent alkylene group having from 5 to 15 carbon atoms, a divalent linear alkylene group having from 4 to 15 carbon atoms that is interrupted by one or more hetero atoms or groups, such as oxygen, nitrogen and sulphur atoms and carbonyl or sulphonyl groups, or a linear alkylene chain having from 2 to 6 carbon atoms interrupted by a cycloalkylene group having from 5 to 7 carbon atoms, $R^2$ represents the residue of a carboxylic acid after removal of a carboxylic acid group, and which may contain an amino or a carboxylic acid group, such as an alkyl group of from 1 to 15 carbon atoms, an aryl group of from 6 to 10 carbon atoms, or an aralkyl or alkaryl group of from 7 to 20 carbon atoms, and $R^3$ represents a residue of a dicarboxylic acid after removal of the two carboxyl groups and which may be substituted by an amino group of a carboxylic acid group, such as an alkylene group of from 2 to 15 carbon atoms or an arylene group of from 6 to 10 carbon atoms, with the proviso that at least one of R, $R^1$, $R^2$, and $R^3$ contains an amino or carboxylic acid group.

Other preferred electrodepositable positive photoresists, salts of which are used in this invention are copolymers of an unsaturated acid o-nitrocarbinol ester with the same or a different unsaturated acid, optionally with one or more other unsaturated monomers. These copolymers have a molecular weight of at least 500 and contain in the molecule at least 5% by weight, by reference to the molecular weight, of aromatic carbocyclic or heterocyclic o-nitrocarbinol ester groups of formula

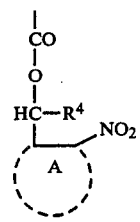

where A denotes an aromatic carbocyclic or heterocyclic ring that may be substituted and has 5 to 14 members, and $R^4$ denotes a hydrogen atom, an alkyl group of from 1 to 8 carbon atoms, or an optionally substituted aryl or aralkyl group, the optional substituents on the groups A and $R^4$ being alkyl or alkoxy groups of from 1 to 8 carbon atoms, halogen atoms, nitro, amino, or carboxylic acid groups.

Suitable ring systems A may be mononuclear or polynuclear, such as benzene, naphthalene, anthracene, anthraquinone, phenanthrene, or pyridine rings.

Examples of suitable aromatic o-nitrocarbinols upon which these o-nitrocarbinol ester groups are based include o-nitrobenzyl alcohol, 2-nitroveratryl alcohol, 6-nitroveratryl alcohol, 2-nitro-4-aminobenzyl alcohol, 2-nitro-4-dimethylaminobenzyl alcohol, 2-nitro-5-dimethylaminobenzyl alcohol, 2-nitro-5-aminobenzyl alcohol, 2-nitro-4,6-dimethoxybenzyl alcohol, 2,4-dinitrobenzyl alcohol, 3-methyl-2,4-dinitrobenzyl alcohol, 2-nitro-4-methylbenzyl alcohol, 2,4,6-trinitrobenzyl alcohol, 2-nitrobenzhydrol, 2,2'-dinitrobenzhydrol, 2,4-dinitrobenzhydrol, 2,2',4,4'-tetranitrobenzhydrol, 2-nitro-4- methylaminobenzyl alcohol, 2-nitro-3-hydroxymethyl naphthalene, 1-nitro-2-hydroxymethyl naphthalene, 1-nitro-2-hydroxymethyl anthraquinone, 3-methoxy-4-(2-nitratoethoxy)-6-nitrobenzyl alcohol and 2-nitro-3-hydroxymethyl pyridine.

Yet other preferred electrodepositable positive photoresists, salts of which are used in this invention, are quinone diazide sulphonyl esters of phenolic novolaks bearing salt-forming groups. Such esters contain at least two, and preferably from two to twenty repeating groups of formula

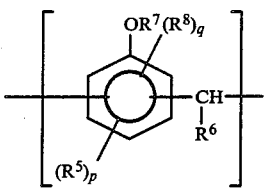
V where $R^5$ denotes a halogen atom, a hydroxyl or alkoxy group, an optionally esterified carboxylic acid or sulphonic acid group, an alkyl, alkenyl, or aryl group that may be substituted by a carboxylic acid group, or a group of formula $-N(R^9)R^{10}$, $-COR^{11}$, $-OCOR^{12}$, $-OSO_2R^{12}$, or $-OSO_2R^{13}$, or one group $R^5$ may represent a group of formula

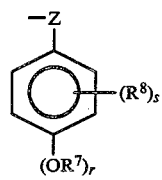
VI which may be connected to adjacent aromatic rings through groups of formula $-CH(R^6)-$ p represents zero, 1, 2 or 3
r represents zero or 1
s represents zero or 1, $R^6$ represents a hydrogen atom or an alkyl, aryl, or carboxylic acid group, $R^7$ represents a hydrogen atom, an alkyl group that may be substituted by hydroxyl or alkoxy, or a group of formula $-SO_2R^{13}$, $-SO_2R^{12}$ or $-COR^{12}$, at least 4% of the groups $R^7$ in the ester having repeating units of formula V representing a group $-SO_2R^{13}$, and preferably at least 8% of such groups $R^7$ being $-SO_2R^{13}$, $R^8$ represents a salt-forming group, especially a carboxylic acid group $-COOH$, a sulphonic acid group $-SO_3H$, a phosphonic acid group $-PO(OH)_2$, a group of formula $-CH_2SO_3H$, or a group of formula $-CH(R^6)-Y-R^{14}-X$, q represents zero or 1, $R^9$ represents a hydrogen atom, an alkyl group, or a group $-COR^{12}$, $-SO_2R^{12}$, or $-SO_2R^{13}$, $R^{10}$ represents a hydrogen atom or an alkyl group, $R^{11}$ represents a monovalent aliphatic or cycloaliphatic group, $R^{12}$ represents a monovalent aliphatic, cycloaliphatic aromatic or araliphatic group, $R^{13}$ represents a 1,2-benzoquinone or naphthoquinone diazide group of formula

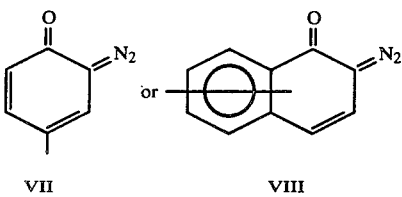

the indicated free valency bond of the naphthoquinone of formula VIII being in the 4-, or 5-position, $R^{14}$ represents a divalent aliphatic, aromatic or araliphatic group which may be substituted by a carboxylic, sulphonic, or phosphoric acid group, Y denotes a sulphur atom or a group of formula $-N(R^{15})-$, where $R^{15}$ represents a hydrogen atom or an alkyl group which may be substituted by a carboxylic acid group or by an optionally etherified hydroxyl group, or $R^{14}$ and $R^{15}$ together form an alkylene chain of 4 or 5 carbon atoms, that may be interrupted in the chain by a nitrogen or sulphur atom, X denotes a carboxylic or sulphonic acid group, or when Y denotes $-N(R^{15})-$, X may further represent a hydrogen atom, a phosphonic acid group, a hydroxyl group, or an amino group of formula $-N(R^{16})R^{17}$, $R^{16}$ and $R^{17}$, which may be the same or different, each represent a hydrogen atom or an alkyl, aryl, aralkyl or alkenyl group, any of which may be substituted by a hydroxyl group, and Z represents an oxygen atom, a sulphur atom, a carbonyl or sulphonyl group or an alkylene group of 1 to 6 carbon atoms, optionally substituted by a halogen atom, a carboxylic acid group, an alkyl group of 1 to 12 carbon atoms or an aryl group of 6 to 12 carbon atoms, the alkyl and aryl groups optionally being substituted by a halogen atom or a hydroxyl group, with the proviso that the said ester contains at least one carboxylic or sulphonic or phosphonic acid, or amino group within the definitions of $R^5$, $R^6$ and $R^8$.

Preferably the alkyl and alkenyl groups, and the alkyl portion of aralkyl groups, within the definition of formula V, have up to 20 carbon atoms, and especially up to 10 carbon atoms, and aryl groups, and the aryl portion of aralkyl groups, have up to 20 and especially up to 15 carbon atoms. More especially, p denotes zero or one and $R^5$ denotes a chlorine or bromine atom, a hydroxyl group, an alkoxy group of 1 to 4 carbon atoms, an alkyl group of 1 to 8 carbon atoms, a carboxylic acid group, a sulphonic acid group, a group $-OSO_2R^{12}$, $-OSO_2R^{13}$, $-OCOR^{12}$, or a group of formula VI, $R^6$ denotes a hydrogen atom, $R^7$ denotes a hydrogen atom, an alkyl group of 1 to 4 carbon atoms optionally substituted by a hydroxyl group or an alkoxy group of 1 to 4 carbon atoms, or a group of formula $-COR^{12}$, $-SO_2R^{12}$ or $-SO_2R^{13}$, $R^7$ and r being selected such that at least 5%, and preferably 9% or more of groups $R^7$ represent $-SO_2R^{13}$, $R^8$ denotes a carboxylic or sulphonic acid group or a group of formula $-CH_2-N(R^{15})R^{14}-X'$ $R^{12}$, $R^{13}$, $R^{14}$ and $R^{15}$ are as hereinbefore defined, X' denotes a hydrogen atom, a carboxylic or sulphonic acid group, a hydroxyl group, or a group $N(R^{16})R^{17}$, where $R^{16}$ and $R^{17}$ are as hereinbefore defined, q and s being selected such that at least 4%, and preferably from 8% to 50% of groups of formula V contain a group $R^8$.

Especially preferred positive photoresists are salts of compounds of formula I or III in which m represents zero, n represents an integer of from 1 to 15, $R^1$ represents an alylene group of from 5 to 10 carbon atoms or a linear alkylene chain of from 2 to 4 carbon atoms interrupted by a cyclohexylene group, and $R^3$ represents a 1,2-, 1,3-, or 1,4-phenylene group substituted by a carboxylic acid group.

Other especially preferred positive photoresists are salts of compounds of formula IV in which A represents a benzene fing which may be substituted, and $R^4$ represents a hydrogen atom.

Yet other especially preferred positive photoresists used in the process of the present invention are salts of those having 2 to 15 repeating units of formula V wherein p denotes zero or 1, $R^5$ denotes an alkyl group of 1 to 4 carbon atoms, a hydroxyl group, a group of formula $-OSO_2R^{13}$, or a group of formula VI (in which Z is an alkylene group substituted by a carboxylic acid group, s denotes zero and r denotes 1)

$R^6$ denotes a hydrogen atom, $R^7$ denotes a hydrogen atom or methyl, ethyl, isopropyl, n-butyl, 2-hydroxyethyl, 2-hydroxypropyl, 2-methoxxyethyl or 2-butoxyethyl group, an acetyl, benzoyl, methanesulphonyl, benzenesulphonyl or p-toluenesulphonyl group, or a group $-SO_2R^{13}$ such that 9% to 50% of the groups $R^7$ denote $-SO_2R^{13}$, $R^8$ denotes a carboxylic or sulphonic acid group or a group of formula $-CH_2N(R^{18})R^{19}$ $R^{13}$ denotes a naphthoquinone group of formula VIII, $R^{18}$ denotes a hydrogen atom or an alkyl group of 1 to 4 carbon atoms that may be substituted by a hydroxyl group, an amino group, or a carboxylic acid group, $R^{19}$ denotes an alkyl or hydroxyalkyl group of 1 to 4 carbon atoms, and when $R^5$ denotes a group of formula VI, then q is zero, and when $R^5$ is other than a group of formula VI, then q is selected such that at least 10%, and preferably from 20% to 100% of the groups of formula V have a group $R^8$.

Sensitisers such as Michler's ketone, benzophenones, and thioxanthones may also be incorporated in the photosensitive mixtures, if desired.

If desired, other water soluble or water-dispersible substances may be mixed with the positive photoresists prior to electrodeposition, in order to improve the quality of the coating deposited. Typical such substances include acrylic resins, alkyd resins and polybutadiene resins having salt-forming functional groups, and resins described in U.S. Pat. No. 4,362,853.

Electrodeposition of the positive photoresists follows known procedures. Voltages up to 200 volts for periods of up to 5 minutes are generally used, but the precise conditions for particular photoresists, substrates and desired thicknesses may be readily determined by those skilled in the art of electrodepositing resinous materials.

The developer used in the present process is selected according to the nature of the photoresist and photolysis products and may be an aqueous or aqueous organic solution of an acid or base or an organic solvent or mixture of solvents. The use of an acid or base to form a salt, and hence solubilise the fractions of photoresist remaining in the exposed areas after irradiation, is preferred. Such solutions are, typically, 1-5% w/w sodium or potassium hydroxide or carbonate, which may be used with acid group-containing photoresists, and 1-5% w/w acetic, lactic, glycolic or toluene-p-sulphonic acids, for use with amine group-containing photoresists.

The use of organic solvents is also a practical possibility and may even be desirable when the photoresist has a low proportion of salt-forming groups in the molecule and so breaks down on irradiation to form some fragments having no such salt-forming group. Typical solvents that may be used include cyclohexanone, 2-ethoxyethanol, toluene, acetone, and mixtures of two or more of these.

Removal of the photoresist after development, and etching of the image, may take place after a further exposure to actinic radiation, or such further exposure may not be necessary. The removal may be effected using the same solvents or solutions as are used in the development stage, or more vigorous solvents, or stronger solutions may be used, or contact between the photoresist and the removing medium may be prolonged, in order to ensure complete removal. The advantage of making a further, non image-forming exposure is that milder conditions for removal of the photoresist may be employed, thus minimising the risk of damage to the metal image. Suitable photoresist-removing agents include 1-10% w/w solutions of sodium or potassium hydroxide or carbonate, toluene-p-sulphonic, lactic, glycolic or acetic acids, and solvents such as cyclohexanone, 2-ethoxyethanol, toluene, acetone, dimethyl formamide, dimethyl acetamide, or dimethyl sulphoxide, and their mixtures.

When the positive photoresist is electrodeposited onto a metal-faced laminate, the latter usually comprises a flat sheet having a synthetic resin core, that may reinforced with woven or non-woven fibres, faced on one or both sides with a metal, especially copper or aluminium. Such laminates may, if desired, have apertures lined with the metal to provide electrical continuity between the two faces. When a laminate having such apertures is used, the electrodeposited photoresist is imagewise exposed to actinic radiation so that the parts thereof coating the apertures remain unexposed, conveniently by aligning the apertures with opaque areas of an image-bearing transparency.

Radiation used in the present invention preferably has a wavelength of 200–600 nm. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure will depend upon a variety of factors which include, for example, the individual compounds used, the proportion of these compounds in the composition, the type of light source, and its distance from the composition. Suitable times may be readily determined by those familiar with photoimaging techniques.

Etching solutions that may be used to remove metal from the exposed areas after development are conventional and may be varied according to the nature of the metal surface, for example, with a copper surface a solution of ammonium persulphate or ferric chloride is usually used.

The following examples illustrate the invention. All parts and percentages are by weight.

The resins used in these examples are prepared as follows:

Resin 1 o-Nitrobenzaldehyde (100.6 g), 1,4-bis(hydroxymethyl)cyclohexane (192 g), and toluene-p-sulphonic acid (0.2 g) are mixed in a flask with dichloromethane (600 g) and heated to reflux under nitrogen. Water which forms is removed using a Dean and Stark trap and, when no further water is evolved, the solvent is removed by distillation. The mixture is then stirred at 140° C. for 16 hours, and finally any remaining volatile material is removed at 140° C. at a pressure of 16 mm Hg. The residue is cooled and diluted with xylene (140 g) to give a solution having a solids content of 66%.

The product is a mixture, comprising a predominant proportion of the acetal of formula I in which $R^1$ represents a 1,4-cyclohexylene group, m represents zero and n represents 1.

The solution from the above reaction (63.9 g) and trimellitic anhydride (19.2 g), are stirred together under reflux, water formed being removed continuously using a Dean and Stark trap. After 3 hours the acid value of the reaction mixture has fallen to 1.20 equivalents/kg and a vacuum is applied in order to eliminate the xylene. The residue is poured into an aluminium tray to give a dark green solid, softening at 90° C., which is ground to a powder. This product, Resin 1, has repeating units of formula III in which $R^1$ represents 1,4-cyclohexylene, $R^3$ represents 1,2-phenylene-4-carboxylic acid, m represents zero and n represents 1.

Resin 2 o-Nitrobenzyl acrylate (13.4 g), methyl methacrylate (4.3 g) and acrylic acid (1.55 g) are dissolved in ethyl acetate (21.6 g) and azobis(isobutyronitrile) (0.21 g) is added. The mixture is kept under nitrogen and heated to reflux. After 23 hours a further quatity of azobis(isobutyronitrile) (0.21 g) is added and the reflux is maintained for a further 6 hours.

The mixture is cooled to ambient temperature and added dropwise to an excess of methanol. A white gelatinous precipitate forms and the upper layer of methanol is removed by decantation. The precipitate is ground with solid carbon dioxide to give a powdery precipitate which is filtered off and dried at 40° C. in vacuo. This product, Resin 2, comprises 14 g of a white powder having an acid value of 0.84 equivalent/kg. It is a copolymer containing 60% by weight of groups of formula IV in which $R^4$ represents a hydrogen atom and A denotes a benzene ring, and 5% by weight of free carboxylic acid groups, derived from the acrylic acid.

Resin 3

The acetal of formula I in which R represents hydrogen, $R^1$ represents a 1,4-cyclohexylene group, and n represents 1 prepared as a 66% solids solution in xylene, as described in the preparation of Resin 1 (63.9 g) is mixed with trimellitic anhydride (14.4 g) and phthalic anhydride (3.7 g). The mixture is heated under reflux, water being removed as it forms by means of a Dean and Stark trap. After 6 hours the acid value of the mixture has fallen to 0.88 equivalent/kg and a vacuum is applied in order to eliminate the xylene. The residue is poured into an aluminium tray where it is allowed to cool to a dark green solid which softens at 65° C. This is ground to a powder to give Resin 3 which has repeating units of formula III in which $R^1$ represents a 1,4-cyclohexylene group, m represents zero, n represents 1, and $R^3$ represents 1,2-phenylene in 25% of the repeating units, and 1,2-phenylene-4-carboxylic acid in 75% of the repeating units.

Resin 4 o-Nitrobenzaldehyde (30.2 g), 1,4-bis(hydroxymethyl) cyclohexane (28.8 g), toluene-p-sulphonic acid (0.032 g), and toluene (100 ml) are mixed and heated under reflux in an atmosphere of nitrogen for 46 hours. Water formed during this period is removed continuously by means of a Dean and Stark trap. Toluene is removed by distillation in vacuo and the residue held at 180° C. for 3 hours. The product is poured into an aluminium tray and allowed to cool, giving 50 g of a dark brown brittle solid which is ground to a powder. This powder is a mixture of acetals of formula I in which $R^1$ represents 1,4-cyclohexylene, m represents zero and n represents an integer of average value 13.

This powder (20 g) is dissolved in xylene (7 g) and trimellitic anhydride (3.8 g) is added. The mixture is heated under reflux for 5 hours, by which time the acid value of the mixture has fallen to 0.82 equivalent/kg. Xylene is then eliminated in vacuo to leave Resin 4. This resin has repeating units of formula III in which $R^1$ represents 1,4-cyclohexylene, $R^3$ represents 1,2-phenylene-4-carboxylic acid, m represents zero and n represents an integer of average value 13.

Resin 5

A novolak resin prepared from 3 moles of phenol, 1 mole of p-tert.butyl phenol, and formaldehyde is reacted with 1,2-naphthoquinone-2-diazide-5-sulphonyl chloride until about 12% of the free hydroxyl groups on the novolak has been esterified. The resultant resin (10 g) is dissolved in 2-butoxyethanol (50 g) and heated to 50° C.

A solution containing sarcosine (0.45 g), paraformaldehyde (0.33 g; containing 91% formaldehyde), 20% aqueous sodium hydroxide (1 g), and butoxyethanol (10 g) is added to the warmed novolak solution and the temperature maintained at 50° C. for 2 hours. The solution is cooled, diluted with water (1 liter) and the product precipitated by the addition of normal HCl (10 ml). The precipitate is washed and dried and a portion (4 g) is added slowly to a mixture of 2-butoxyethanol (4 g) and 20% aqueous sodium hydroxide (0.5 g), to give a red-brown solution. Water is then added to form a 10% solution of Resin 5, which has an average of 9 repeating units of Formula V, in which $R^5$ represents 4-tert.butyl, p has an average value of 0.25, $R^6$ represents hydrogen, $R^7$ is hydrogen for 88% of the units and is 1,2-naphthoquinone-2-diazide-5-sulphonyl for 12% of the units, $R^8$ denotes a group —CH$_2$—N(CH$_3$)CH$_2$COOH, and q is such that 8% of the repeating units of formula V have groups $R^8$.

Resin 6

A solution containing sarcosine (0.89 g), paraformaldehyde (0.66 g; containing 91% formaldehyde), 20% aqueous sodium hydroxide (2 g), and 2-butoxyethanol (10 g), is added to a solution of the novolak 1,2-naphthoquinone-2-diazide-5-sulphonyl ester intermediate prepared as described for Resin 5 (10 g) in 2-butoxyethanol (50 g) and heated to 50° C. After 2 hours at 80° C. the mixture is cooled, diluted with water (500 ml) and normal aqueous hydrochloric acid added to pH 2.5. The precipitate is filtered off, washed with water, and dried in a vacuum oven at 35° C. to give 10 g of product.

A portion of this product (4 g), is added slowly to a mixture of 2-butoxyethanol (4 g) and aqueous 20% potassium hydroxide (0.5 g) to give a clear red-brown solution of Resin 6, which has an average of 9 repeating units of formula V in which $R^5$ represents 4-tert.butyl, p has an average value of 0.25, $R^6$ represents hydrogen, $R^7$ is hydrogen for 88% of the units and is 1,2-naphthoquinone-2-diazide-5-sulphonyl for 12% of the units, $R^8$ denotes a group $-CH_2-N(CH_3)CH_2COOH$, and q is such that 15% of the repeating units of formula V have groups $R^8$.

Resin 7

A novolak prepared from 3 moles of phenol, 1 mole of p-tert.butyl phenol, and formaldehyde (12 g), is dissolved in 2-butoxyethanol (50 g) and treated with diethanolamine (2.1 g), formalin (2.4 g; 38.3% HCHO), and lactic acid (2.1 g; 75%). The mixture is heated at 80° C. for 3 hours, cooled, diluted with water (1 liter), adjusted to pH 6, and filtered. The precipitate is washed with water and dried in a vacuum oven at 35° C. to give 12 g of the novolak Mannich base with diethanolamine.

This product is dissolved in acetone (40 g) and a solution of 1,2-naphthoquinone-2-diazide-5-sulphonyl chloride (3 g) in acetone (20 g) is added, followed by 5% aqueous sodium carbonate to pH 8. The mixture is stirred for 1 hour at room temperature, then adjusted to pH 3 with decinormal HCl, giving a clear aqueous solution. Aqueous sodium hydroxide is added to pH 6 and the precipitate that forms is filtered off and dried in a vacuum oven at 35° C.

A sample of the product (4 g) is dissolved in 2-butoxyethanol (4 g) and diluted with water (32 g), to give a 10% solution of Resin 7, which has an average of 9.5 repeating units of formula V in which $R^5$ denotes 4-tert.butyl, p has an average value of 0.25. $R^6$ represents hydrogen, $R^7$ is hydrogen for 89% of the units and is 1,2-naphthoquinone-2-diazide-5-sulphonyl for 11% of the units, $R^8$ denotes a group $-CH_2N(CH_2CH_2OH)_2$ and q is such that 20% of the repeating units of formula V have groups $R^8$.

Resin 8

A novolak is prepared by heating phenol, p-tert.butyl phenol, hydroquinone sulphonic acid potassium salt and formaldehyde (as 38.8% formalin) in a mole ratio 0.75:0.25:0.1:0.88. After distilling off all volatiles a resin is obtained with a softening point of 146° C. The novolak (18 g) is dissolved in acetone (50 g) and treated with a solution of 1,2-naphthoquinone-2-diazide-5-sulphonyl chloride (6 g) in acetone (20 g). The mixture is adjusted to pH 8 by the addition of 10% aqueous sodium carbonate, then stirred at room temperature for 1 hour. It is then added dropwise to 0.2N HCl solution (2.5 liters) and the precipitate filtered off, washed with water and dried in a vacuum oven at 35° C. to give 18 g of Resin 8, which has an average of 7.3 repeating units of formula V in which $(R^5)_p$ denotes p-tert.butyl in 23% of the units and p-hydroxyl in 9% of the units, with p denoting zero in the remaining 68% of the units, $R^6$ denotes hydrogen, $R^7$ denotes 1,2-naphthoquinone-2-diazide-5-sulphonyl in 10% of the units and hydrogen in 90% of the units, and $(R^8)_q$ denotes a sulphonic acid group in 9% of the units.

Resin 9

A novolak is prepared by heating phenol, 4-tert.butylphenol, 4,4-bis(4-hydroxyphenyl)pentanoic acid, and formaldehyde (as 38.8% formalin) using oxalic acid as catalyst, in a molar ratio 0.75:0.25:0.1:0.99:0.016. Volatile matter is removed by distillation and a novolak resin is obtained with a softening point of 119° C. The novolak (18 g) is dissolved in acetone (50 g) and treated with a solution of 1,2-naphthoquinone-2-diazide-5-sulphonyl chloride (6 g) in acetone (20 g). The mixture is adjusted to pH 8 by the addition of 10% aqueous sodium carbonate, then stirred at room temperature for 1 hour. It is then added dropwise to 0.2N HCl solution (2.5 liters) and the precipitate filtered, washed with water and dried in a vacuum oven at 35° C. to give 18 g of Resin 9, a novolak having, on average 5.8 repeating units of formula V in which $(R^5)_p$ denotes p-tert.butyl in 23% of the units and a group of formula VI in 9% of the units, with p denoting zero in the remaining 68% of units, $R^6$ denotes hydrogen, $R^7$ in formula V and $(R^7)_r$ in formula VI are such that 9% of such groups are 1,2-naphthoquinone-2-diazide-5-sulphonyl and the other 91% of such groups are hydrogen, q and s denote zero and Z denotes a group of formula

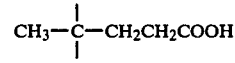

Resin 10

A novolak is prepared by heating, phenol, p-tert.butyl phenol, p-hydroxybenzoic acid, formaldehyde (as 38.8% formalin) and oxalic acid in a mole ratio 0.5:0.5:0.2:1.08:0.016. After distilling off all the volatiles a resin is obtained with a softening point of 120° C. The novolak (18 g) is dissolved in acetone (50 g) and treated with a solution of 1,2-naphthoquinone-2-diazide-5-sulphonyl chloride (6 g) in acetone (20 g). The mixture is adjusted to pH 8 by the addition of 10% aqueous sodium carbonate solution, then stirred at room temperature for 1 hour. It is then added dropwise to 0.2N HCl solution (2.5 liters) and the precipitate filtered, washed with water and dried in a vacuum oven at 35° C. to give 18.5 g of Resin 10, a novolak having, on average, 6.1 repeating units of formula V in which $(R^5)_p$ denotes p-tert.butyl in 42% of the units with p denoting zero in the remaining 58% of the units, $R^6$ denotes hydrogen, $R^7$ denotes 1,2-naphthoquinone-2-diazide-5-sulphonyl in 10% of the units and hydrogen in the remaining 90% of the units, and $(R^8)_q$ denotes 4-carboxylic acid in 16% of the units with q denoting zero in the remaining 84% of the units.

Resin 11

A novolak prepared from 3 moles of phenol, 1 mole of p-tert.butyl phenol, and formaldehyde (36 g), is dissolved in 2-butoxyethanol (36 g), and thioglycolic acid (13.8 g) and paraformaldehyde (14.9 g; having 91% formaldehyde content) are added. The mixture is heated at 140° C. for 2 hours, then a vacuum is applied and the mixture is heated at 180° C. to remove all volatile material.

A sample of the product (18 g) is dissolved in acetone (40 g) and a solution of 1,2-naphthoquinone-2-diazide-5-sulphonyl chloride (6 g) in acetone (20 g) in added. The mixture is adjusted to pH 8 with 10% aqueous sodium carbonate solution (56 g), then stirred at room temperature for 1 hour. Dropwise addition of 2N hydrochloric acid (2 liters) follows, and the yellow resinous precipitate is filtered off, washed with water, and dried. The product, Resin 11 (18.8 g) has an average of 9.5 repeating units of formula V in which $R^5$ denotes 4-tert.butyl, p has an average value of 0.25, $R^6$ represents hydrogen, $R^7$ is hydrogen for 82% of the units and is 1,2-naphthoquinone-2-diazide-5-sulphonyl for 18% of the units, $R^8$ denotes a group $-CH_2SCH_2COOH$, and q is such that 50% of the repeating units of formula V have groups $R^8$.

Resin 12

Resin 9 (13.8 g) is dissolved in 2-butoxyethanol (40 g) and heated to 50° C. A solution of sarcosine (0.61 g), paraformaldehyde (0.46 g; having a 91% formaldehyde content), 20% aqueous sodium hydroxide (1 g) and 2-butoxyethanol (15 g) is added to the mixture which is kept at 50° C. for 2 hours. The product is recovered by precipitation in 0.13N hydrochloric acid solution. The precipitate is filtered off, washed with water, and dried to give Resin 12 (13 g), which has an average of 5.8 repeating units of formula V in which $(R^5)_p$ denotes p-tert.butyl in 23% of the units and a group of formula VI in 9% of the units, with p denoting zero in the remaining 68% of units, $R^6$ denotes hydrogen, $R^7$ in formula V and $(R^7)_r$ in formula VI are such that 9% of such groups are 1,2-naphthoquinone-2-diazide-5-sulphonyl and the other 91% of such groups are hydrogen, $R^8$ denotes a group $-CH_2-N(CH_3)CH_2COOH$, q and s are such that 7% of the groups of formula V and VI have groups $R^8$, and Z denotes a group of formula

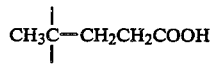

EXAMPLE 1

Resin 1 (1 part) is dissolved in 2-butoxyethanol (1 part) neutralised with potassium hydroxide solution and diluted with water to give a solution containing 10% of Resin 1. The resin is electrodeposited onto a copper clad laminate anode, using a stainless steel cathode. A deposit 10 μm thick forms after 20 seconds at 40 volts.

The laminate is withdrawn from the bath, rinsed with water and dried for 10 minutes at 90° C. It is then irradiated through an image-bearing transparency for 2 minutes, using a 5000 w medium pressure mercury halide lamp at a distance of 75 cm. Immersion in 2% aqueous sodium hydroxide gives a clear positive image of the transparency.

The exposed copper is etched away by immersion in a 40% aqueous solution of ferric chloride at 30° C., after which the plate is washed in water and dried. It is then exposed to the 5000 w lamp a second time for 2 minutes, without the image-bearing transparency. Immersion for 45 seconds in 2% aqueous sodium hydroxide completely removes residual resin, leaving a clear image of the original transparency, in copper, on the laminate base.

EXAMPLE 2

Resin 2 (8 parts) is dissolved in a 2:1 mixture of 2-butoxyethanol and 2-ethoxyethyl acetate (10 parts) to give a clear solution, then neutralised with 20% aqueous postassium hydroxide solution. Water is added to give a solution of pH 7 having a 10% total solids content.

The resin is electrodeposited onto a copper clad laminate anode, using a stainless steel cathode. A deposit 24 μm thick forms after 10 seconds at 10 volts. This is rinsed with water and dried at 90° C. for 10 minutes. The coating is irradiated through an image-bearing transparency for 2 minutes, using a 5000 w medium pressure mercury halide lamp at a distance of 75 cm. When the coating is brushed with 5% aqueous sodium hydroxide solution, a clear positive image of the transparency forms.

The exposed copper is removed by immersion in a 40% aqueous solution of ferric chloride at 30° C., after which the plate is washed with water and dried. It is then exposed to the 5000 w lamp a second time with the image-bearing transparency, exposure being for 5 minutes. Immersion in 5% aqueous sodium hydroxide solution completely removes the residual resin, leaving a clear, positive image of the original transparency in copper on the laminate base.

EXAMPLE 3

Resin 3 is dissolved in an equal weight of 2-butoxyethanol, neutralised with potassium hydroxide solution, and diluted with water to give a solution of 10% Resin 3. The resin is electrodeposited onto a copper clad laminate anode using a stainless steel cathode. A deposit 11 μm thick forms after 30 seconds at 40 volts. The laminate is rinsed with water and dried for 10 minutes at 90° C.

The electrodeposited film is irradiated through an image-bearing transparency for 8 minutes, using a 5000 w medium pressure mercury halide lamp at a distance of 75 cm. On brushing with a 2% aqueous solution of sodium hydroxide at ambient temperature, a clear positive image of the transparency forms.

The exposed copper is removed in an aqueous solution of ferric chloride (40%) at 30° C., after which the plate is washed with water and dried. It is then exposed to the mercury halide lamp a second time for 2 minutes and without the transparency. Brushing for 5 minutes in 2% aqueous sodium hydroxide solution completely removes the residual resin film, leaving a positive image of the transparency in copper on the laminate base.

EXAMPLE 4

Resin 4 is dissolved in an equal weight of 2-butoxyethanol, neutralised with a 20% aqueous solution of potassium hydroxide, and water added to give a solution having a 10% solids content.

The resin is electrodeposited onto a copper clad laminate anode, using a stainless steel cathode. A deposit 21 μm thick forms after 20 seconds at 40 volts. This is rinsed with water and dried at 90° C. for 10 minutes. The coating is irradiated through an image-bearing transparency for 10 minutes using a 5000 w medium pressure mercury halide lamp at a distance of 75 cm. When the coating is brushed with 5% aqueous sodium hydroxide solution a clear, positive image of the transparency forms.

The exposed copper is removed in an aqueous solution of ferric chloride (40%) at 30° C., after which the plate is washed with water and dried. It is then exposed to the mercury halide lamp a second time, without the image-bearing transparency. The exposure time is 5 minutes. Immersion in 5% aqueous sodium hydroxide solution completely removes the residual resin, leaving a clear, positive image in copper of the transparency on the laminate base.

EXAMPLE 5

A 10% solution of Resin 5 (40 g) is mixed with a 10% aqueous solution of maleinised polybutadiene (5 g). Electrodeposition is effected using a copper clad laminate anode and a stainless steel cathode. A deposit 11 micrometers thick forms on the anode after 20 seconds at 100 volts.

The laminate is removed from the bath, rinsed with water, and dried for 5 minutes at 90° C. It is then irradiated through an image-bearing transparency for 5 minutes, using a 5000 w medium pressure mercury halide lamp at a distance of 75 cm. Immersion in 2% aqueous sodium hydroxide solution gives a clear positive image of the transparency.

The exposed copper is etched away by immersion in 40% aqueous ferric chloride at 30° C., after which the plate is washed in water and dried. It is then exposed a second time to the 5000 w lamp, this time for one minute and without the image-bearing transparency. Immersion in 2% aqueous sodium hydroxide completely removes the residual resin, leaving a clear image of the original transparency, in copper, on the laminate base.

EXAMPLE 6

Example 5 is repeated, electrodeposition being effected onto a plated-through hole board as anode and a stainless steel cathode. A deposit 17 micrometers thick forms on both sides of the board after 2 minutes at 80-120 volts. The resin is also deposited on the sides of the holes through the board. The board is withdrawn from the bath, washed with water, and dried for 5 minutes at 90° C. Both sides of the board are irradiated through image-bearing transparencies for 30 seconds using a 5000 w medium pressure mercury halide lamp at a distance of 75 cm. Immersion in 2% aqueous sodium hydroxide give clear positive images of the transparencies, which are chosen such that the holes in the board are not exposed and the resin remains on the sides of the holes after development.

The exposed copper is removed by etching in a 40% aqueous solution of ferric chloride at 30° C., after which the board is washed and dried. It is then exposed a second time on both sides to the 5000 w lamp for 1 minute, without the image-bearing transparencies. Immersion in 2% aqueous sodium hydroxide completely removes residual resin, leaving clear images in copper of the original transparencies on both sides of the board, and copper on the sides of the holes through the board.

EXAMPLE 7

The solution of the Resin 6 is diluted with water to 10% solids content and the resultant solution, (40 g), is mixed with a 10% aqueous solution of an anionic resin prepared as described in Example 15 of U.S. Pat. No. 4,362,853 (5 g), and deposited onto a copper clad laminate anode, using a stainless steel cathode. A deposit 7 micrometers thick forms after 30 seconds at 80 volts. The laminate is withdrawn, washed with water, and dried at 90° C. for 5 minutes. It is then irradiated through an image-bearing transparency for 2 minutes, using a 5000 w medium pressure mercury halide lamp at a distance of 75 cm. Immersion in 2% aqueous sodium hydroxide solution gives a clear positive image of the transparency.

EXAMPLE 8

The solution of Resin 7 (40 g) is mixed with a 10% solution of a cationic polybutadiene resin (4 g) and electrodeposited onto a copper clad laminate cathode using a stainless steel anode. A deposit 5 micrometers thick forms after 30 seconds at 10 volts. The laminate is withdrawn from the bath, dried at 90° C. for 5 minutes and is then irradiated through an image-bearing transparency for 1 minute using a 5000 w medium pressure mercury halide lamp at a distance of 75 cm. Immersion in 2% aqueous sodium hydroxide gives a clear positive image of the transparency.

EXAMPLE 9

Resin 8 (10 g) is dissolved in 2-butoxyethanol (10 g), neutralised with normal potassium hydroxide solution, and water added to 100 g. The resin is electrodeposited onto a copper clad laminate anode, using a stainless steel cathode. A deposit 12 micrometers thick forms after 60 seconds at 80 volts.

The laminate is withdrawn from the bath, rinsed with water and dried for 5 minutes at 90° C. It is then irradiated through an image-bearing transparency for 1 minute, using a 5000 w medium pressure mercury halide lamp at a distance of 75 cm. Immersion in 2% aqueous sodium hydroxide gives a clear positive image of the transparency.

EXAMPLE 10

Example 9 is repeated, replacing the resin used in that Example by an equal quantity of Resin 9. A deposit 12 micrometers thick forms after 60 seconds at 60 volts. Drying and irradiation, as described in Example 9, gives a clear positive image on the laminate.

The exposed copper is removed by etching in a 40% aqueous solution of ferric chloride at 30° C., after which the plate is washed with water and dried. It is then exposed a second time to the 5000 w lamp for 1 minute, without the image-bearing transparency. Immersion for 30 seconds in 1% aqueous sodium hydroxide completely removes residual resin, leaving a clear image of the original transparency, in copper, on the laminate base.

EXAMPLE 11

Example 9 is repeated, replacing the resin used in that Example by Resin 10. A deposit 8 micrometers thick forms after 60 seconds at 75 volts. Irradiation and development follow, as described in Example 9, giving a clear positive image of the transparency on the laminate.

EXAMPLE 12

Example 5 is repeated, but omitting the maleinised polybutadiene. A deposit 29 micrometers thick forms after 20 seconds at 40 volts. This deposit is irradiated through a transparency and developed, as described in Example 5, and a clear positive image of the transparency forms on the copper surface. Removal of exposed copper by etching with ferric chloride, and final removal of residual coating by re-exposure and immersion in 2% sodium hydroxide leaves a clear image of the original transparency, in copper, on the laminate base.

EXAMPLE 13

Resin 11 (1 part) is dissolved in 2-butoxyethanol (1 part) neutralised with 20% aqueous potassium hydroxide solution, and water added to give a solution containing 10% of the resin.

The resin is deposited onto a copper clad laminate anode, using a stainless steel cathode. A deposit 2 micrometers thick forms after 60 seconds at 80 volts. This is rinsed with water, and dried at 90° C. for 5 minutes. The coating is irradiated through an image-bearing transparency for 1 minute using a 5000 w medium pressure mercury halide lamp at a distance of 75 cm. When the coating is immersed in a 2% aqueous sodium hydroxide solution, a clear, positive image of the transparency is formed on the copper surface.

EXAMPLE 14

Example 13 is repeated, replacing Resin 11 by Resin 12. A deposit 3 micrometers thick forms after 60 seconds at 30 volts. This is irradiated as described in Example 13, and the image developed by treatment with 1% aqueous sodium hydroxide solution. A clear, positive image is formed.

What is claimed is:

1. A process for the production of an image which comprises
    (i) applying by electrodeposition a positive photoresist comprising a molecule having a salt-forming group onto a substrate having an electrically conductive surface whereby an adherent, substantially uniform layer consisting essentially of a positive photoresist composition is electrodeposited on said surface,
    (ii) exposing the electrodeposited layer to actinic radiation in a predetermined pattern, such that exposed areas of the electrodeposited layer become more soluble in a developer than unexposed areas, and
    (iii) removing exposed areas by contact with a developer.

2. A process according to claim 1 in which the substrate is of carbon, silicon, a thermoset resin, a thermoset resin containing electroconductive particles, or a metal.

3. A process according to claim 2 in which the substrate is a metal-faced laminate.

4. A process according to claim 3 which comprises
    (i) applying by electrodeposition a positive photoresist onto a metal surface of a metal-faced laminate whereby an adherent, substantially uniform layer of the photoresist is deposited on said surface,
    (ii) exposing the electrodeposited layer to actinic radiation in a predetermined pattern, such that the electrodeposited layer becomes more soluble in a developer in the exposed areas than in the unexposed areas,
    (iii) removing the layer in exposed areas by contact with a developer,
    (iv) removing metal from the metal surface in areas from which the electrodeposited layer has been removed in step (iii), and
    (v) removing residual electrodeposited layer by contact with a suitable solvent.

5. A process according to claim 4 in which, following step (iv) and preceding step (v), the laminate is further exposed to actinic radiation such that the residual electrodeposited layer is solubilized.

6. A process according to claim 1 in which the positive photoresist is of the formula

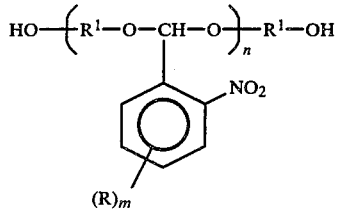

or

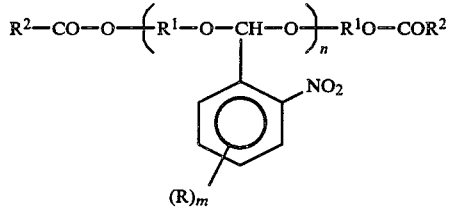

or it contains a repeating unit of formula

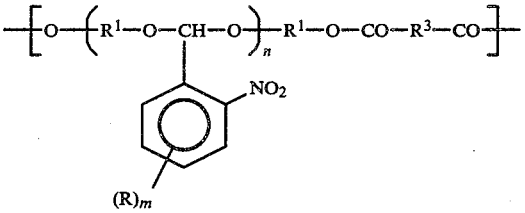

where
m represents zero or an integer of from 1 to 4,
n represents an integer of from 1 to 20,
R represents an alkyl, alkoxy, nitro, amino, or carboxylic acid group, such groups being the same or different when m is greater than 1,
$R^1$ represents a residue of an organic diol remaining after removal of two hydroxyl groups,
$R^2$ represents a residue of a carboxylic acid after removal of a carboxylic acid group,
$R^3$ represents a residue of a dicarboxylic acid after removal of two carboxyl groups,
with the proviso that at least one of R, $R^1$, $R^2$, and $R^3$ contains an amino or carboxylic acid group.

7. A process according to claim 6, in which $R^1$ represents a divalent alkylene group having from 5 to 15 carbon atoms, a divalent linear alkylene group having from 4 to 15 carbon atoms that is interrupted by one or more hetero atoms or groups, or a linear alkylene chain having from 2 to 6 carbon atoms interrupted by a cycloalkylene group having from 5 to 7 carbon atoms, or such groups substituted by an amino or carboxylic acid group.

8. A process according to claim 6 in which $R^3$ represents an alkylene group of from 2 to 15 carbon atoms or an arylene group of from 6 to 10 carbon atoms, or such groups substituted by an amino or carboxylic acid group.

9. A process according to claim 6 in which the photoresist is of formula I or III and m represents zero, n represents an integer of from 1 to 15, $R^1$ represents an alkylene group of from 5 to 10 carbon atoms or a linear alkylene chain of from 2 to 4 carbon atoms interrupted by a cyclohexylene group, and $R^3$ represents a 1,2-, 1,3-, or 1,4-phenylene group substituted by a carboxylic acid group.

10. A process according to claim 1 in which the photoresist is a copolymer, having a molecular weight of at least 500, of an unsaturated acid o-nitrocarbinol ester with an unsaturated acid and containing at least 5% by weight, by reference to molecular weight, of carbocyclic or heterocyclic o-nitrocarbinol ester groups of formula

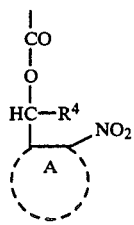  IV where
A denotes an aromatic carbocyclic or heterocyclic ring that has 5 to 14 members, or such groups substituted by one or more alkyl or alkoxy groups of from 1 to 8 carbon atoms, halogen atoms, nitro, amino or carboxylic acid groups, and $R^4$ denotes a hydrogen atom, an alkyl group of from 1 to 8 carbon atoms, an aryl group, an aralkyl group, or an aryl or aralkyl group substituted by one or more alkyl or alkoxy groups of from 1 to 8 carbon atoms, halogen atoms, nitro, amino, or carboxylic acid groups.

11. A process according to claim 10 in which the ring system A is a benzene, naphthalene, anthracene, anthraquinone, phenanthrene, or pyridine ring.

12. A process according to claim 1 in which the photoresist is a quinone diazide sulfonyl ester of a phenolic novolak containing at least two repeating groups of formula

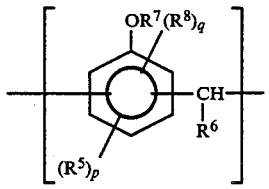  V where
$R^5$ denotes a halogen atom, a hydroxyl or alkoxy group, a carboxylic acid or sulfonic acid group, an esterified carboxylic acid or sulfonic acid group, an alkyl, alkenyl, or aryl group, an alkyl, alkenyl or aryl group substituted by a carboxylic acid group, or a group of formula $-N(R^9)R^{10}$, $-COR^{11}$, $-O-COR^{12}$, $-OSO_2R^{12}$, or $-OSO_2R^{13}$, or one group $R^5$ represents a group of formula

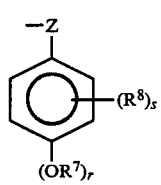  VI which may be connected to adjacent aromatic rings through groups of formula $-CH(R^6)-$ p represents zero, 1, 2 or 3,
r represents zero or 1,
s represents zero or 1,
$R^6$ represents a hydrogen atom or an alkyl, aryl, or carboxylic acid group,
$R^7$ represents a hydrogen atom, an alkyl group, an alkyl group substituted by hydroxyl or alkoxy, or a group of formula $-SO_2R^{13}$, $-SO_2R^{12}$ or $-COR^{12}$, at least 4% of the groups $R^7$ in the ester having repeating units of formula V representing a group $-SO_2R^{13}$,
$R^8$ represents a salt-forming group,
q represents zero or 1,
$R^9$ represents a hydrogen atom, an alkyl group, or a group $-COR^{12}$, $-SO_2R^{12}$, or $-SO_2R^{13}$,
$R^{10}$ represents a hydrogen atom or an alkyl group,
$R^{11}$ represents a monovalent aliphatic or cycloaliphatic group,
$R^{12}$ represents a monovalent aliphatic, cycloaliphatic, aromatic or araliphatic group,
$R^{13}$ represents a 1,2-benzoquinone or naphthoquinone diazide group of formula

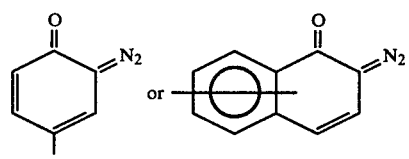

VII            VIII the indicated free valency bond of the naphthoquinone of formula VIII being in the 4-, or 5-position,
Z represents an oxygen atom, a sulfur atom, a carbonyl or sulfonyl group, an alkylene group of 1 to 6 carbon atoms, an alkylene group of 1 to 6 carbon atoms substituted by a halogen atom, a carboxylic acid group, an alkyl group of 1 to 12 carbon atoms, an aryl group of 6 to 12 carbon atoms, or an alkyl group of 1 to 12 carbon atoms or an aryl group of 6 to 12 carbon atoms substituted by a halogen atom or a hydroxyl group, with the proviso that said ester contains at least one carboxylic or sulfonic or phosphonic acid, or amino group within the definitions of $R^5$, $R^6$, and $R^8$.

13. A process according to claim 12 in which $R^8$ represents a carboxylic acid group, a sulfonic acid group, a phosphonic acid group, a group of formula $-CH_2SO_3H$, or a group of formula $-CH(R^6)-Y-R^{14}-X$, where
$R^6$ is as defined in claim 12,
$R^{14}$ represents a divalent aliphatic, aromatic or araliphatic group or a divalent-aliphatic, aromatic, or araliphatic group substituted by a carboxylic, sulfonic, or phosphonic acid group,
Y denotes a sulfur atom or a group of formula $-N(R^{15})-$, where $R^{15}$ represents a hydrogen atom, an alkyl group, or an alkyl group substituted by a carboxylic acid group or by a hydroxyl group or by an etherified hydroxyl group, or $R^{14}$ and $R^{15}$ together form an alkylene chain of 4 or 5 carbon atoms, or an alkylene chain of 4 or 5 carbon atoms interrupted in the chain by a nitrogen or sulfur atom, X denotes a carboxylic or sulfonic acid group, or when Y denotes —N($R^{15}$)—, X may further represent a hydrogen atom, a phosphonic acid group, a hydroxyl group, a hydroxyl group, or an amino group of formula —N($R^{16}$)$R^{17}$, and $R^{16}$ and $R^{17}$, which may be the same or different, each represent a hydrogen atom or an alkyl, aryl, aralkyl or alkenyl group, or an alkyl, aryl, aralkyl, or alkenyl group substituted by a hydroxyl group.

14. A process according to claim 12 in which p denotes zero or one and $R^5$ denotes a chlorine or bromine atom, a hydroxyl group, an alkoxy group of 1 to 4 carbon atoms, an alkyl group of 1 to 8 carbon atoms, a carboxylic acid group, a sulfonic acid group, a group —OSO$_2$$R^{12}$, —OSO$_2$$R^{13}$, —OCOR$^{12}$, or a group of formula VI, $R^6$ denotes a hydrogen atom, $R^7$ denotes a hydrogen atom, an alkyl group of 1 to 4 carbon atoms, an alkyl group of 1 to 4 carbon atoms substituted by a hydroxyl group or by an alkoxy group of 1 to 4 carbon atoms, or a group of formula —COR$^{12}$, —SO$_2$$R^{12}$, or —SO$_2$$R^{13}$, $R^7$ and r being selected such that at least 5% of groups $R^7$ represent —SO$_2$$R^{13}$, $R^8$ denotes a carboxylic or sulfonic acid group or a group of formula —CH$_2$—N($R^{15}$)$R^{14}$—X'

$R^{12}$ and $R^{13}$ are as defined in claim 12, $R^{14}$ represents a divalent aliphatic, aromatic, or araliphatic group or a divalent aliphatic, aromatic or araliphatic group substituted by a carboxylic, sulfonic, or phosphonic acid group, $R^{15}$ represents a hydrogen atom, an alkyl group, an alkyl group substituted by a carboxylic acid group or by a hydroxyl group or by an etherified hydroxyl group, or $R^{14}$ and $R^{15}$ together form an alkylene chain of 4 or 5 carbon atoms or an alkylene chain of 4 or 5 carbon atoms interrupted in the chain by a nitrogen or sulfur atom, X' denotes a hydrogen atom, a carboxylic or sulfonic acid group, a hydroxyl group, or a group N($R^{16}$)$R^{17}$, $R^{16}$ and $R^{17}$, which may be the same or different, each represent a hydrogen atom, or an alkyl, aryl, aralkyl or alkenyl group or an alkyl, aryl, aralkyl, or alkenyl group substituted by a hydroxyl group, q and s being selected such that at least 4%, of groups of formula V contain a group $R^8$.

15. A process according to claim 12 in which the ester has 2 to 15 repeating units of formula V wherein p denotes zero or 1, $R^5$ denotes an alkyl group of 1 to 4 carbon atoms, a hydroxyl group, a group of formula —OSO$_2$$R^{13}$, or a group of formula VI (in which Z is an alkylene group substituted by a carboxylic acid group, s denotes zero and r denotes 1)

$R^6$ denotes a hydrogen atom, $R^7$ denotes a hydrogen atom or a methyl, ethyl, isopropyl, n-butyl, 2-hydroxyethyl, 2-hydroxypropyl, 2-methoxyethyl or 2-butoxyethyl group, an acetyl, benzoyl, methanesulfonyl, benzenesulfonyl or p-toluenesulfonyl group, or a group —SO$_2$$R^{13}$ such that 9% to 50% of the groups $R^7$ denote —SO$_2$$R^{13}$, $R^8$ denotes a carboxylic or sulfonic acid group or a group of formula —CH$_2$N($R^{18}$)$R^{19}$ $R^{13}$ denotes a naphthoquinone group of formula VIII, $R^{18}$ denotes a hydrogen atom, an alkyl group of 1 to 4 carbon atoms, or an alkyl group of 1 to 4 carbon atoms substituted by a hydroxyl group, an amino group, or a carboxylic acid group, $R^{19}$ denotes an alkyl or hydroxyalkyl group of 1 to 4 carbon atoms, and when $R^5$ denotes a group of formula VI, then q is zero, and when $R^5$ is other than a group of formula VI, then q is selected such that at least 10% of the groups of formula V have a group $R^8$.

16. A process according to claim 1 in which the electrodeposition is carried out at a voltage up to 200 volts and for a period of up to 5 minutes.

17. A process according to claim 1 in which the developer is a 1–5% w/w sodium or potassium hydroxide or carbonate solution, or a 1–5% w/w acetic, lactic, glycolic, or toluene-p-sulfonic acid solution.

18. A process according to claim 1 in which the developer is cyclohexanone, 2-ethoxyethanol, toluene, acetone, or a mixture of two or more thereof.

19. A process according to claim 4, in which step (v) is effected with a 1–10% w/w solution of sodium or potassium hydroxide or carbonate, toluene-p-sulfonic, lactic, glycolic, or acetic acids or a solvent or mixture of solvents selected from cyclohexanone, 2-ethoxyethanol, toluene, acetone, dimethyl formamide, dimethyl acetamide, or dimethyl sulfoxide.

* * * * *